United States Patent [19]

Kinsey et al.

[11] Patent Number: 4,593,804
[45] Date of Patent: Jun. 10, 1986

[54] APPARATUS FOR GUIDING A CIRCUIT BOARD ONTO A TESTING LOCATION ON A TEST FIXTURE

[75] Inventors: Graeme R. Kinsey, Clayton; William M. Riesenberg, Walnut Creek, both of Calif.

[73] Assignee: Zehntel, Inc., Walnut Creek, Calif.

[21] Appl. No.: 789,923

[22] Filed: Oct. 21, 1985

Related U.S. Application Data

[63] Continuation of Ser. No. 573,413, Jan. 24, 1984, abandoned.

[51] Int. Cl.⁴ .............................................. B65G 47/24
[52] U.S. Cl. ........................................ 193/41; 33/562; 269/303; 269/900
[58] Field of Search ............... 193/38, 41; 324/73 PC, 324/158 F; 221/172; 271/232; 33/174 G, 184.5; 269/303, 309, 310, 900

[56] References Cited

U.S. PATENT DOCUMENTS

| | | | |
|---|---|---|---|
| 382,402 | 5/1888 | Baltes | 271/223 |
| 2,621,807 | 12/1952 | Rendich | 269/900 |
| 2,772,485 | 12/1956 | Gelb | 33/184.5 |
| 3,016,489 | 1/1962 | Briggs et al. | 324/158 |
| 3,250,529 | 5/1966 | Eissfeldt | 271/165 X |
| 3,805,159 | 4/1974 | Richelmann | 324/158 F |
| 3,906,363 | 9/1975 | Power | 324/73 PC |
| 4,017,793 | 4/1977 | Haines | 324/73 |
| 4,108,528 | 8/1978 | Long et al. | 339/117 |
| 4,138,186 | 2/1979 | Long et al. | 339/117 |

FOREIGN PATENT DOCUMENTS 147363  11/1980  Japan ............................... 324/73 PC Primary Examiner—Jeffrey V. Nase
Attorney, Agent, or Firm—Arnold, White & Durkee

[57] ABSTRACT

A circuit board is guided into the correct position over the testing location of a test fixture by means of at least one guide located outside and near to the circumference of the testing location. The surface of the guide which faces the testing location is sloped outwards and upwards, the guide preferably being conical in shape. In test fixtures provided with tooling guide pins which fit through tooling holes on the circuit board for the purpose of accurate positioning over the test location, the lower part of the guide to approximately the same height as the pins is cylindrical, the upper part of the guide being conical.

6 Claims, 5 Drawing Figures

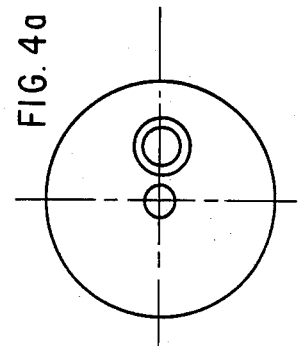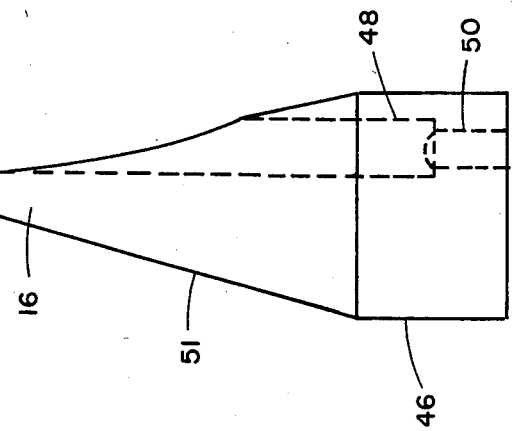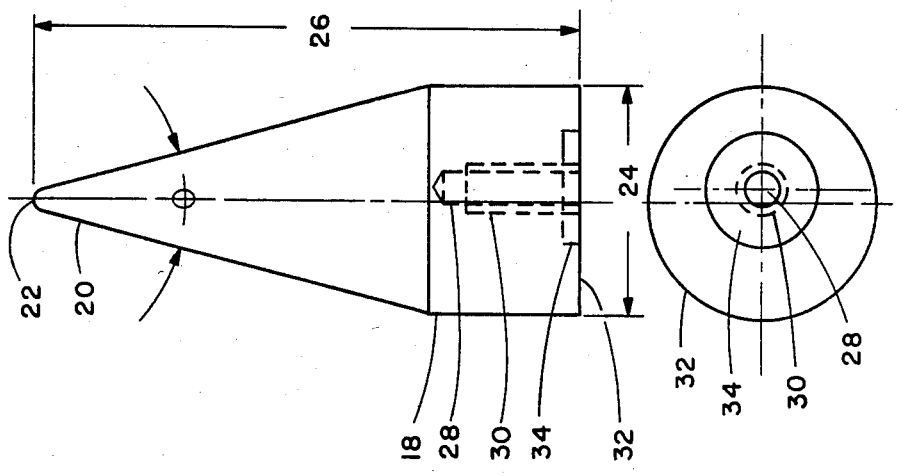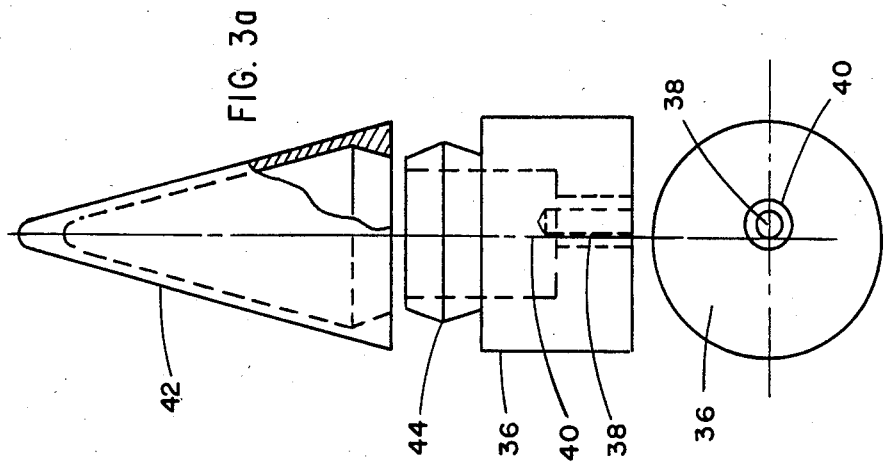

APPARATUS FOR GUIDING A CIRCUIT BOARD ONTO A TESTING LOCATION ON A TEST FIXTURE This application is a continuation of co-pending application Ser. No. 573,413, filed Jan. 24, 1984, now abandoned.

BACKGROUND OF THE INVENTION

This invention relates to a means of guiding a circuit board which is to be tested into accurate positioning on a test location on a test fixture. It is particularly intended for use with test fixtures of the bed of nails type, and with automatic and robotic means of placement of the board.

Bed of nails test fixtures are widely used in the electronics industry for the electrical testing of printed circuit boards, both bare and loaded. The board is brought into electrical contact with an array of test probes which are placed so as to contact predetermined test points on the board. Testing of the entire circuit, or of the individual circuits of components, can be carried out using methods known to those skilled in the art.

In order for the test results to be accurate, the test probes must accurately contact the corresponding test points on the board. As modern board design produces increased circuit and component density, the required degree of accuracy of contact is also increased.

In almost all commercially available test fixtures in present use, accurate positioning of the printed circuit board to be tested over the test probe array is achieved by the use of tooling guide pins fixed onto the test fixture. Most printed circuit boards are supplied with two or more tooling holes as part of the process of manufacture, and for such boards the tooling guide pins are placed so that the board is correctly located when the tooling guide pins are located in the board's tooling holes. For boards which do not have tooling holes, tooling guide pins located so as to contact the edges of the board may be used.

It is obvious that, the better the fit between the tooling guide pin and the tooling hole, the more accurate the placement of the board will be. Conversely, the more accurate this fit, the more difficult it is to place the board onto the tooling guide pins. It has been for several years the common experience of those in the field that tooling guide pins often became bent or damaged because of misplacement. Also, the need for accurate placement means that the process takes more time, and the operator tires more quickly.

The common prior art solution to this problem was to use large diameter tooling guide pins, and to make the tooling holes of a diameter significantly larger than the diameter of the guide pin. However, while having the tooling hole larger than the guide pin made it easier to locate the board over the guide pins, the resulting play meant loss of positioning accuracy. Also, with the trend to increasing circuit and component density on circuit boards, the space available on the boards for tooling holes is limited. Another prior art solution was to taper the tips of the guide pins, thus making insertion of those pins into the tooling holes a little easier. This meant, however, that the tips of the pins were weakened and more easily damaged.

Further problems were encountered by those in the field when attempts were made to automate the testing process. In order to align the tooling holes with the tooling guide pins, alignment in all six degrees of freedom, that is left/right, back/forward, up/down and pitch, yaw and roll, must be achieved with a high degree of repeatability and accuracy. This is extremely difficult for a robot to achieve.

SUMMARY OF THE INVENTION

The above noted and other disadvantages of the prior art are overcome by providing a set of guides around the edges of the test location which guide the board into accurate registration with the testing location and the tooling guide pins.

The present invention provides an apparatus for guiding a circuit board onto a testing location on a test fixture comprising at least one substantially rigid, substantially smooth guide pin adapted to engage the circuit board so as to guide the circuit board onto the testing location, and at least one substantially rigid, substantially smooth guide located outside and near to the circumference of the testing location. The surface of the guide which faces the testing location is sloped upwards and outwards away from the testing location. The base of this surface is so located that, when the corresponding edge of the circuit board is lying against this base, the circuit board is correctly positioned over the testing location.

Preferably, the sloping surface of the guide is at an angle of between about 5° and 20° to the vertical.

In one embodiment, the guide is in the shape of a cone, apex upwards, the preferred angle of the cone being between about 10° and 40°.

In another embodiment, at least one of the guides is affixed to the test fixture by fixing means which permit adjustments of the position of the guide relative to the circumference of the testing location.

In the embodiment using conical guides, the preferred adjustable fixing means for at least one of the guides is a screw inserted substantially vertically upwards through the upper surface of the test fixture into the base of the guide at a point not at the center of the base.

The present invention further provides an apparatus for guiding a circuit board which is free to move in two or more degrees of freedom onto a testing location on a test fixture, comprising at least one substantially rigid, substantially smooth guide located outside and near to the circumference of the testing location. The surface of the guide which faces the testing location is vertical to the plane of the testing location for a height approximately equal to the height of the guide pins, and above that height it is sloped upwards and outwards away from the testing location. The base of this surface is so located that, when the corresponding edge of the circuit board is lying against this base, the circuit board is correctly positioned over the testing location.

Preferably, the sloping surface of the guide is at an angle of between about 5° and 20° to the vertical.

In one embodiment, the guide is in the shape of a cylinder surmounted by a cone with its apex upwards, the base diameter of the cone being at least equal to the diameter of the cylinder.

In the preferred embodiment, the angle of the cone portion of the guide is between about 10° and 40°.

In another embodiment, at least one of the guides is affixed to the test fixture by fixing means which permit adjustments of the position of the guide relative to the circumference of the testing location.

In the embodiment using guides in the shape of a cylinder surmounted by a cone, the preferred adjustable fixing means for at least one of the guides is a screw inserted substantially vertically upwards through the upper surface of the test fixture into the base of the guide at a point not at the center of the base.

It is an advantage of the invention that it provides a new and improved means for accurately placing a circuit board over the primary circuit board guides, usually tooling pins, at a testing location on a test fixture. With this invention, it will be possible to automate a boring and repetitive task presently performed by human operators, and in cases where automation is not convenient or desirable, this invention makes the task of the human operator much easier and less fatiguing.

The above and other objects and advantages of the present invention will become apparent from a detailed description of the preferred embodiment when read in conjunction with the drawings.

BRIEF DESCRIPTION OF THE DRAWINGS

FIG. 2a is an elevation and FIG. 2b is a plan view of one embodiment of a guide.

FIGS. 3a and 4a are elevation views and FIGS. 3b and 4b are plan views of alternative embodiments of a guide.

DETAILED DESCRIPTION OF THE PREFERRED EMBODIMENT

Figure 1:
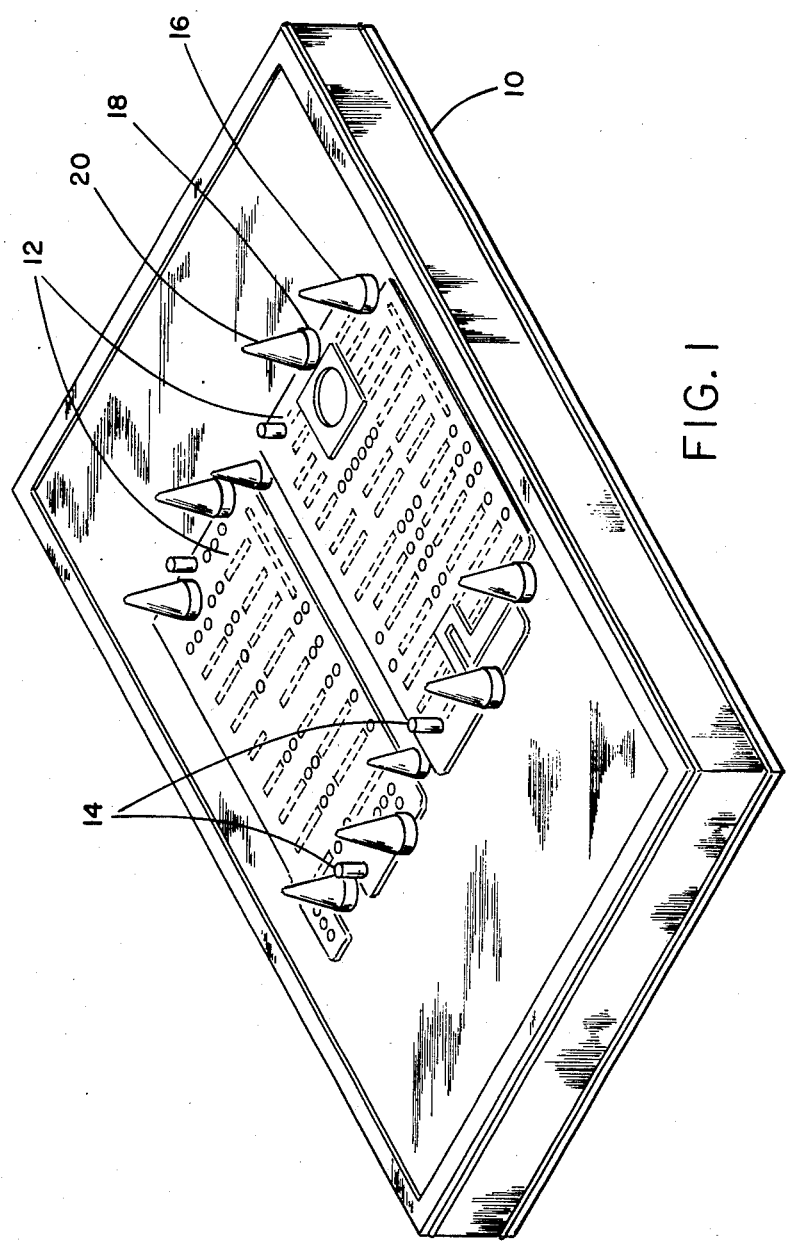
FIG. 1 is a perspective view of a circuit board test fixture embodying guides according to this invention.

FIG. 1 shows a view of the test fixture 10, with a testing location 12 on its upper surface. In the particular embodiment shown, there are two separate testing locations 12 for testing a double board assembly. Located within the testing location are one or more tooling guide pins 14, which are fixed in the surface of the testing location vertical to the plane of the testing location. Preferably, the guide pins are made of a polished metal and are approximately 0.1 inches in diameter and approximately 0.5 inches long.

Located around and outside the circumference of the testing location 12 is at least one guide 16. The number of guides required will depend on the shape of the board, and the number of degrees of freedom of movement which it has while being placed in position. For a rectangular board which is free to move in all six degrees of freedom, a minimum of three guides 16 is required to define the position of one corner and one side. In the preferred embodiment, for the usual rectangular circuit board at least four guides are used to define the position of all four sides. These guides are made of a substantially rigid material with a low coefficient of friction and good resistance to abrasion such as metal or nylon. In the preferred embodiment the guides are made of an acetal homopolymer sold by Dupont, under the trademark "Delrin".

A cross sectional view of one embodiment of the guides 16 is shown in FIG. 2a. The lower portion 18 of the guide 16 is cylindrical, and extends to a height approximately equal to the height of the tooling guide pins 14. The upper portion 20 of the guide is conical in shape, the tip 22 of the cone 20 preferably being rounded off to prevent injury to an operator using the test fixture 10. The dimensions of the cone 20 should be chosen to best suit the particular circumstances. For example, if a longer cone is used the initial accuracy of placement of the board to be tested need be less than if a shorter cone is used, but in certain applications a longer cone may interfere with the operation of other apparatus. Similarly, a thicker cone is less susceptible to damage than a thinner cone, but the diameter may be dictated by space limitations. In the preferred embodiment the base diameter 24 of the cone 20 is approximately 0.75 inches and the height 26 of the cone 20 is approximately 1.25 inches.

The relative height 26 and diameter 24 of the cone 20 must also be determined so as to give a suitable cone angle $\theta$. If a wide angle $\theta$ is used, there can be a greater variation in initial placement which still results in guidance into the correct final position than is possible with a narrow angle $\theta$. However, if the angle $\theta$ is wide, the base diameter 24 of the cone 20 must be correspondingly large, and in most applications the space available on the test fixture for the guides is limited. Further, the board has a tendency to stick on the guide if the angle $\theta$ is too wide. The preferred angle of slope of the surface of the cone 20 is between about 5° and 20° to the vertical, therefore the cone angle $\theta$ is preferably between about 10° and 40°.

In the embodiment shown in FIGS. 2a and 2b, the guide 16 is fixed to the test fixture 10 by means of a screw 28 which is screwed into a threaded hole 30 in the base 32 of the guide 16. Preferably, this hole 30 is offset from the center line of the guide 16, allowing the guide to move in eccentric path about the screw 28. This allows adjustment of the position of the guide relative to the circumference of the testing location 12 to compensate for wear, initial installation error and for slight variations between production runs of the boards to be tested. In the preferred embodiment a star washer 34 is countersunk into the base 32 around the screw 28 in order to provide grip between the base 32 of the guide 16 and the surface of the test fixture 10.

An alternative embodiment of a guide 16 is shown in FIGS. 3a and 3b. This is in two parts, a base 36 which is screwed onto the test fixture 10 by means of a screw 38 in an offset threaded screw hole 40 in the base 36, and a removable cone section 42 which snap fits onto the base 36 by means of the snap fitting 44. The advantage of a two part guide is that the cone section 42, which is the most likely to be damaged and which receives the most wear, can be readily replaced without having to dismantle the test fixture 10.

In circumstances where it is not possible to dismantle the test fixture 10 in order to fix the guides 16 onto the top of the test fixture by means of screws or their equivalent inserted from below (as in the embodiments shown in FIGS. 2a, 2b and 3a, 3b, the alternative embodiment shown in FIG. 4 may be used. In this, the guide 16 may be screwed onto the test fixture 10 from above through threaded hole 48 by means of a self tapping screw 50 or equivalent device, which is offset so as to permit adjustment of the guide 16 similar to that of the embodiments shown in FIGS. 2 and 3. Alternatively, a guide similar to that shown in FIGS. 4a and 4b but made in two parts may be used, the base 46 being glued onto the test fixture 10, and the cone 51 being attached to the base by means of a screw or similar device through the offset hole 48.

Figure 5:
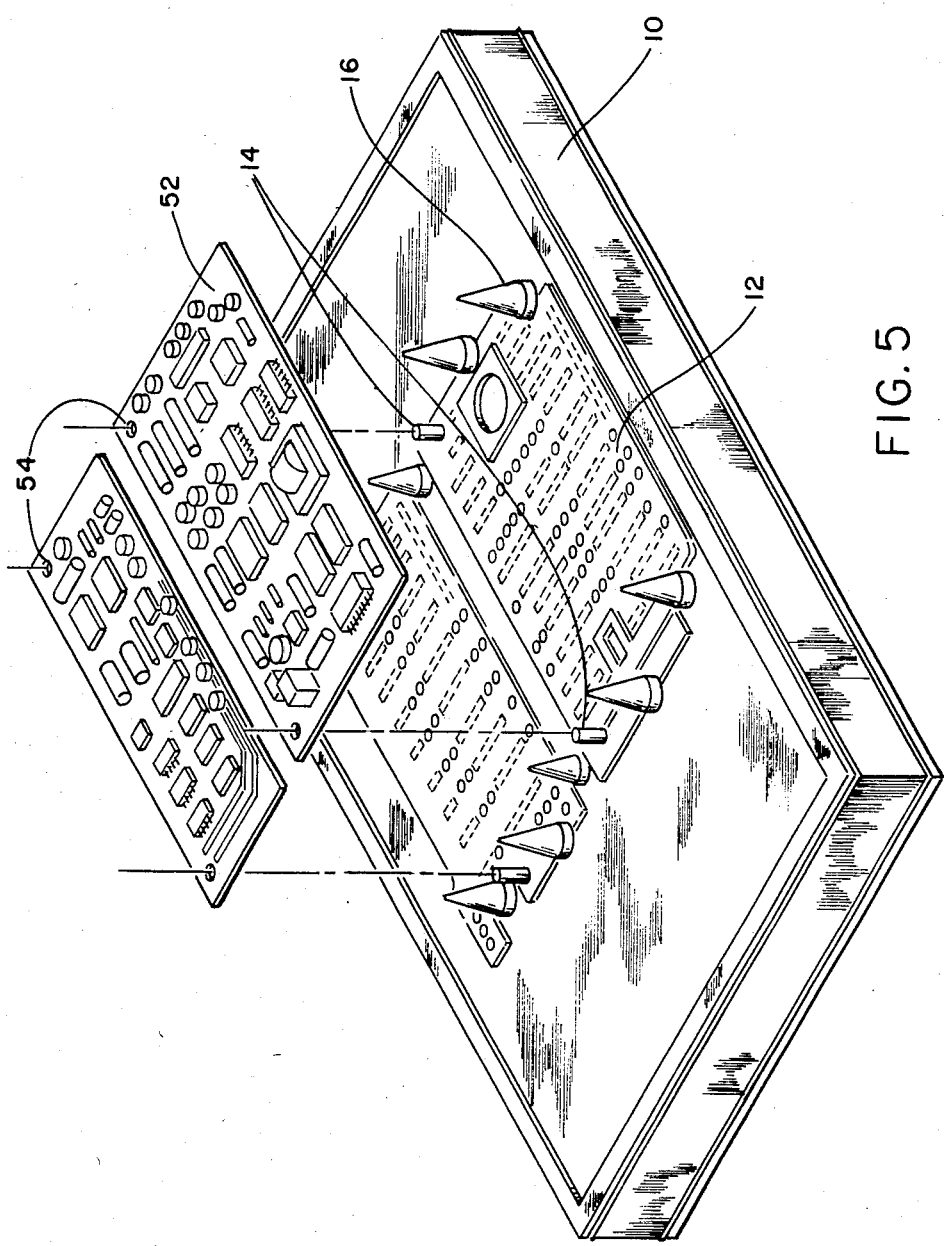
FIG. 5 is a perspective view, showing the location of a circuit board over the testing surface of the circuit board test fixture.

FIG. 5 shows a printed circuit board 52 ready to be guided into position so that the tooling holes 54 pass over the tooling guide pins 14. If there is any lateral error in the initial positioning of the board, the slope of the conical portion 20 of the guide 16 causes the board 52 to be moved laterally into the correct position. Because there are guides on all four sides of the board any lateral positioning error can be corrected. Further, the presence of guides 16 on each side of the board 52, together with the force exerted by gravity on the board, tends to correct any rotation of the board 52 about any of its three rotational axes away from the plane of the testing location 12. Therefore, by the time the board 52 reaches the tops of the guide pins 16, it is laterally positioned so that the guide pins 16 connect with the tooling holes 54, and is substantially horizontal to the plane of the testing location 12 so that it travels freely over the vertical guide pins 16.

Additional advantages and modifications will be readily apparent to those skilled in the art. The invention in its broader aspects is therefore not limited to the specific details, representative apparatus or the illustrative example shown and described. Accordingly, departures may be made from the detail without departing from the spirit or scope of the disclosed general inventive concept.

What is claimed is:

1. Apparatus for guiding a circuit board which is free to move in two or more degrees of freedom onto a testing location on a test fixture, comprising:
   at least one substantially rigid, substantially smooth guide pin adapted to engage the circuit board so as to guide the circuit board onto the testing location, each guide pin is vertical to the plane of the testing location for a predetermined height, and at least one substantially rigid, substantially smooth guide located outside and near to the circumference of the testing location, each guide having a surface which faces the testing location and is vertical to the plane of the testing location for a height approximately equal to the height of the guide pins and thereabove is sloped upwards and outwards away from the testing location, a base of this surface being so located that, when the corresponding edge of the circuit board is lying against this base, the circuit board is correctly positioned so as to engage the guide pin.

2. Apparatus for guiding a circuit board which is free to move in two or more degrees of freedom onto a testing location, as described in claim 1, wherein the sloping part of the surface of the guide is at an angle of between about 5° and 20° to the vertical.

3. Apparatus for guiding a circuit board which is free to move in two or more degrees of freedom onto a testing location, as described in claim 1, wherein the guide is in the shape of a cylinder surmounted by a cone with its apex upwards, the base diameter of the cone being at least equal to the diameter of the cylinder.

4. Apparatus for guiding a circuit board which is free to move in two or more degrees of freedom onto a testing location, as described in claim 3, wherein the angle of the cone is between about 10° and 40°.

5. Apparatus for guiding a circuit board which is free to move in two or more degrees of freedom onto a testing location, as described in claims 1 or 3, wherein at least one of the guides is affixed to the test fixture by fixing means which permit adjustments of the position of the guide relative to the circumference of the testing location.

6. Apparatus for guiding a circuit board which is free to move in two or more degrees of freedom onto a testing location, as described in claim 3, wherein at least one of the guides is affixed to the test fixture by fixing means which permit adjustments of the position of the guide relative to the circumference of the testing location, the fixing means comprising a screw inserted substantially vertically upwards through the upper surface of the circuit board test fixture into the base of the guide at a point not at the center of the base.

* * * * *